US005395251A

United States Patent [19]

Rodriguez et al.

[11] Patent Number: 5,395,251

[45] Date of Patent: Mar. 7, 1995

[54] BOARD RETAINER SYSTEM FOR ACTIVE ELECTRICAL CONNECTOR ASSEMBLY

[75] Inventors: Charles J. Rodriguez; Rajagopalan Chandrasekhar, both of Clearwater, Fla.

[73] Assignee: The Whitaker Corporation, Wilmington, Del.

[21] Appl. No.: 141,161

[22] Filed: Oct. 21, 1993

[51] Int. Cl.[6] ........ H05K 1/00

[52] U.S. Cl. ........ 439/66; 439/326; 439/71

[58] Field of Search ........ 439/70-73, 439/62, 65, 326-328, 372, 325, 630-637

[56] References Cited

U.S. PATENT DOCUMENTS

| | | | |
|---|---|---|---|
| 3,638,163 | 1/1972 | Loosme | 339/17 M |
| 3,701,071 | 10/1972 | Landman | 439/326 |
| 3,985,413 | 10/1976 | Evans | 339/17 LM |
| 4,113,342 | 9/1978 | Andreaggi | 439/630 |
| 4,818,241 | 4/1989 | Smoot | 439/65 |
| 5,035,628 | 7/1991 | Casciotti et al. | 439/66 |
| 5,052,942 | 10/1991 | Rauterberg | 439/326 |
| 5,069,627 | 12/1991 | Buck et al. | 439/66 |
| 5,118,300 | 6/1992 | Zarreii | 439/79 |
| 5,224,873 | 7/1993 | Duffet et al. | 439/326 |

*Primary Examiner*—David Pirlot
*Attorney, Agent, or Firm*—Anton P. Ness

[57] ABSTRACT

A retainer system for holding a board (14) with active electrical components in an electrical connector assembly includes a boss (50,66) secured to the housing (48,64,84) of the connector assembly, with the boss having an elongated slot (52,68) open toward the other end of the housing. The slot is sized so that one end of the board is receivable therein with sufficient clearance to allow pivoting motion of the board toward and away from the housing about that one end within the slot. At the other end of the connector assembly housing is a retainer (54,72,82,100). After the one end of the board is inserted into the slot and the board is pivoted toward the housing, the retainer overlies the opposed end of the board.

15 Claims, 4 Drawing Sheets

BOARD RETAINER SYSTEM FOR ACTIVE ELECTRICAL CONNECTOR ASSEMBLY

FIELD OF THE INVENTION

This invention relates to an electrical connector assembly utilizing an intermediate board with active electrical components and, more particularly, to a retainer system for such a board.

BACKGROUND OF THE INVENTION

U.S. Pat. No. 5,118,300, issued Jun. 2, 1992, discloses in FIGS. 14–16 a connector assembly for interconnecting a daughter board and a mother board. This connector assembly includes an elastomeric contact element of the type disclosed in U.S. Pat. No. 3,985,413, issued Oct. 12, 1976, and sold under the trademark AMPLIFLEX by AMP Incorporated of Harrisburg, Pa., for incorporating a circuit with active elements in the paths between the daughter board and the mother board. The contents of U.S. Pat. No. 5,118,300 and the contents of U.S. Pat. No. 3,985,413 are hereby incorporated by reference herein.

As disclosed in the '300 patent, the active element circuit is mounted on a board secured to the connector assembly by an overlying spring clip which is removably clampable around opposed sides of the connector assembly housing. While effective for its intended purpose, the spring clip is relatively difficult to manipulate when a circuit board is installed to, and/or removed from, the connector assembly. In addition, the spring clip is a relatively expensive item.

It is therefore an object of the present invention to provide a board retainer system for an active electrical connector which is easier to utilize and is less costly than the spring clip of the '300 patent.

SUMMARY OF THE INVENTION

The referenced '300 patent discloses a connector assembly which electrically interconnects a first plurality of conductors on the surface of a dielectric substrate with respective ones of a second plurality of conductors on the surface of a dielectric housing. The connector assembly includes a resilient contact element having an elongated cylindrical elastomeric body member and a flexible film wrapped around the body member, the film having a third plurality of parallel straight line conductors on its surface facing away from the body member so that the third plurality of conductors extends around the body member. There are at least as many of the third plurality of conductors as there are of each of the first and second pluralities of conductors. The dielectric housing has an elongated open channel on its surface supporting the contact element therein, with the second plurality of conductors on the housing surface being within the channel. In accordance with the principles of this invention, the foregoing and additional objects are attained by providing an arrangement for securing the substrate to the housing. This arrangement comprises at least one receiving means secured to the housing for receiving one end of the substrate in overlying relation to the housing surface. The receiving means is arranged to allow pivoting movement of the substrate toward and away from the housing surface. The inventive arrangement further comprises at least one retainer secured to the housing on the side of the channel away from the receiving means for holding the opposed end of the substrate after the substrate one end is received by the receiving means and the substrate is pivoted toward the housing surface, with each retainer thereafter overlying the opposed end of the substrate. The receiving means and the retainer are so configured that when the substrate is received by the receiving means and thereafter held by the retainer, the contact element is deformably compressed by the substrate within the channel, thereby insuring good electrical connections.

In accordance with an aspect of this invention, each retainer is integrally molded as part of the housing.

In accordance with another aspect of this invention, each retainer includes a base secured to the housing, the base being resilient and movable toward and away from the receiving means, and also includes a latch head secured to the base, the latch head having a lip adjacent the base and adapted to overlie the opposed end of the substrate.

In accordance with a further aspect of this invention, the housing is formed with at least one cavity on the side of the channel away from the receiving means, and each retainer includes a generally planar base adapted to be inserted into a respective cavity, the base including means for preventing removal of the base from the cavity. Each retainer further includes a latch head secured to the base and extending out of the plane of the base toward the receiving means, the latch head adapted to overlie the opposed end of the substrate.

BRIEF DESCRIPTION OF THE DRAWINGS

The foregoing will be more readily apparent upon reading the following description in conjunction with the drawings in which like elements in different figures thereof are identified by the same reference numeral and wherein.

DETAILED DESCRIPTION OF THE PREFERRED EMBODIMENTS

Figure 1:
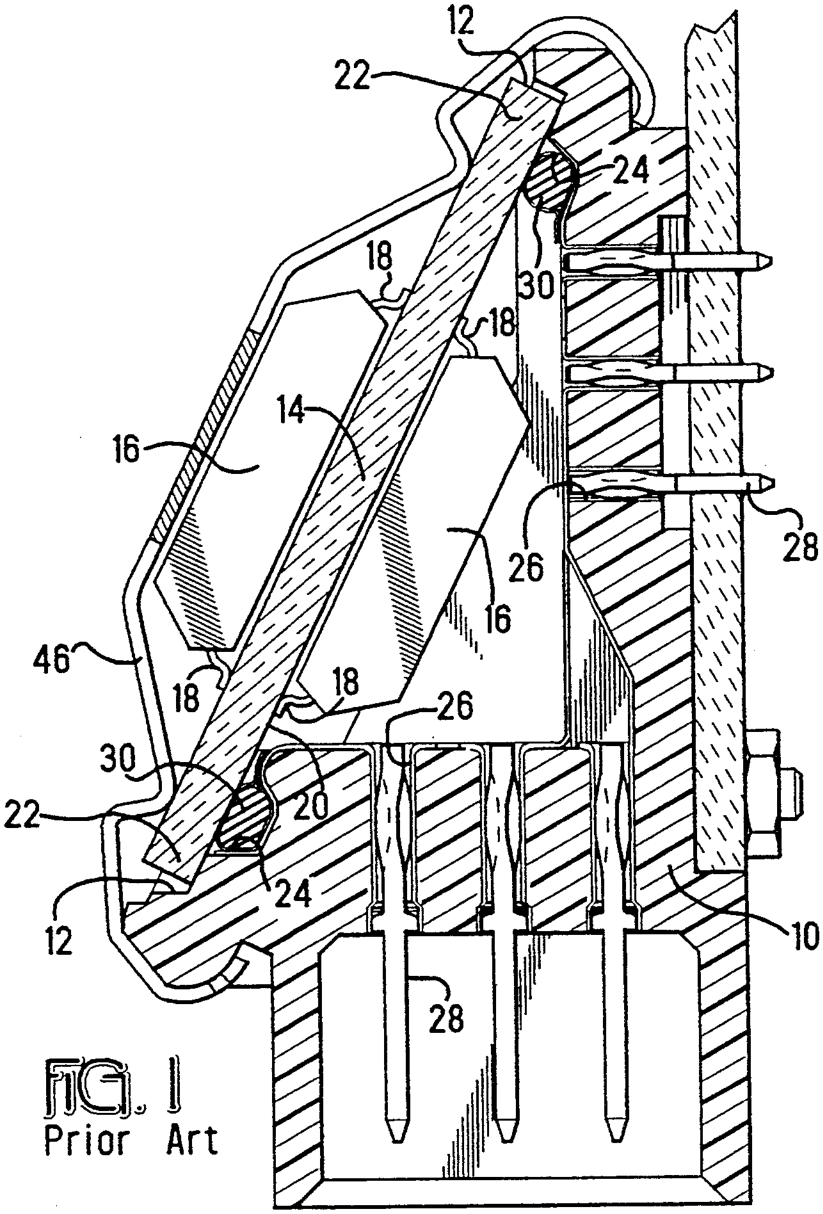
FIG. 1 Prior Art
FIG. 1 is an elevational and sectional view of the prior art connector assembly of the referenced U.S. Pat. No. 5,118,300.

As shown in FIG. 1, the connector assembly disclosed in the referenced U.S. Pat. No. 5,118,300 includes a housing 10 of dielectric material suitable for the coating or plating of conductive material thereon. The housing 10 includes, on interior surfaces thereof, a pair of spaced apart surfaces 12 adapted to receive a dielectric substrate 14 including one or more active components 16. The components 16 have leads 18 soldered surface-mount style to conductors on the surface 20 of the substrate 14 and which extend to the opposed ends 22 of the substrate 14.

Adjacent to the surfaces 12 are elongated open channels 24 which have surface conductors therein which in turn join conductive material extending into the cavities 26 within the housing 10, to be engaged by the contacts 28. Held within the channels 24 are resilient contact elements 30 of the type shown in FIG. 2 and disclosed in the referenced U.S. Pat. No. 3,985,413.

Figure 2:
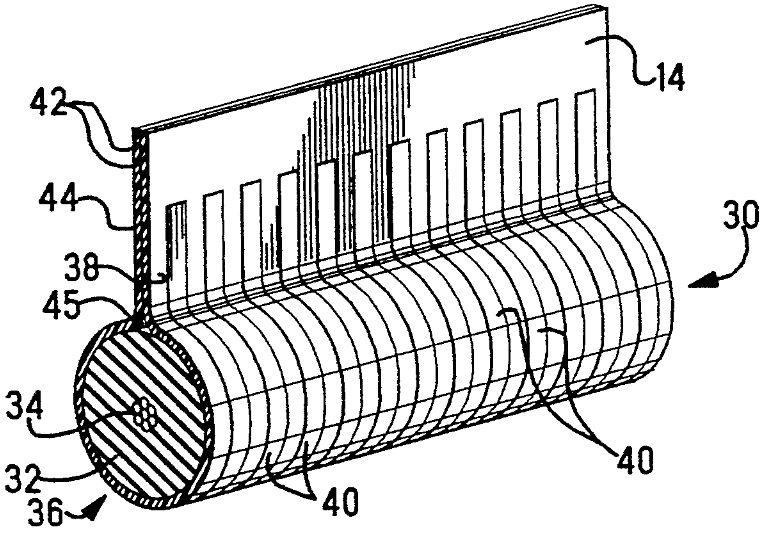
FIG. 2 Prior Art
FIG. 2 is a perspective view of the elastomeric contact element disclosed in the referenced U.S. Pat. No. 3,985,413.

As shown in FIG. 2, each of the contact elements 30 comprises a cylindrical elastomeric body 32 which may have a center core 34 of fiber glass or metal strands. A flexible circuit generally indicated at 36 is wrapped around the body 32. The flexible circuit 36 comprises a thin film 38 of polymeric material which should be flexible so that it can be wrapped around the body 32 but which will not elongate significantly when stressed in a tensile mode. The film 38 has a plurality of parallel relatively narrow straight conductors 40 on its external surface which faces away from the body 32. The width of the film 38 as viewed in FIG. 2 is significantly greater than the circumference of the body 32. The marginal side portions 42 are against each other and extend radially with respect to the body 32 to form a tab 44. The opposed surfaces of these marginal side portions 42 are bonded to each other by suitable bonding material 45. The conductors 40 are of uniform length and have their ends in alignment. These ends do not extend to the side edges of the film (i.e., the free end of the tab 44) so that there is a portion of film adjacent to the free end of the tab 44 which is devoid of conductors. Preferably, the conductors 40 are about 0.003 inches wide and spaced apart about 0.007 inches. Thus, for each of the conductors on the surface 20 of the substrate 14 and for each of the conductors within the channels 24 of the housing 10, there is a multiplicity of individual conductors 40 of the contact element 30. This multiplicity is on the order of two or three.

Each of the contact elements 30 is held within a respective one of the channels 24 and is resilient to provide a force driving the conductors 40 outwardly in a manner to interconnect the conductors on the substrate 14 with respective ones of the conductors on the surfaces of the channels 24.

The substrate 14 is secured to the housing 10 by a spring clip or bracket 46. With the bracket 46 latched in place, as shown in FIG. 1, the substrate 14 is urged firmly against the connectors 30 to thereby deformably compress the connectors 30 against the surfaces of the channels 24 and establish assured electrical connection between the conductors on the substrate 14 and respective ones of the conductors in the channels 24.

Figure 3:
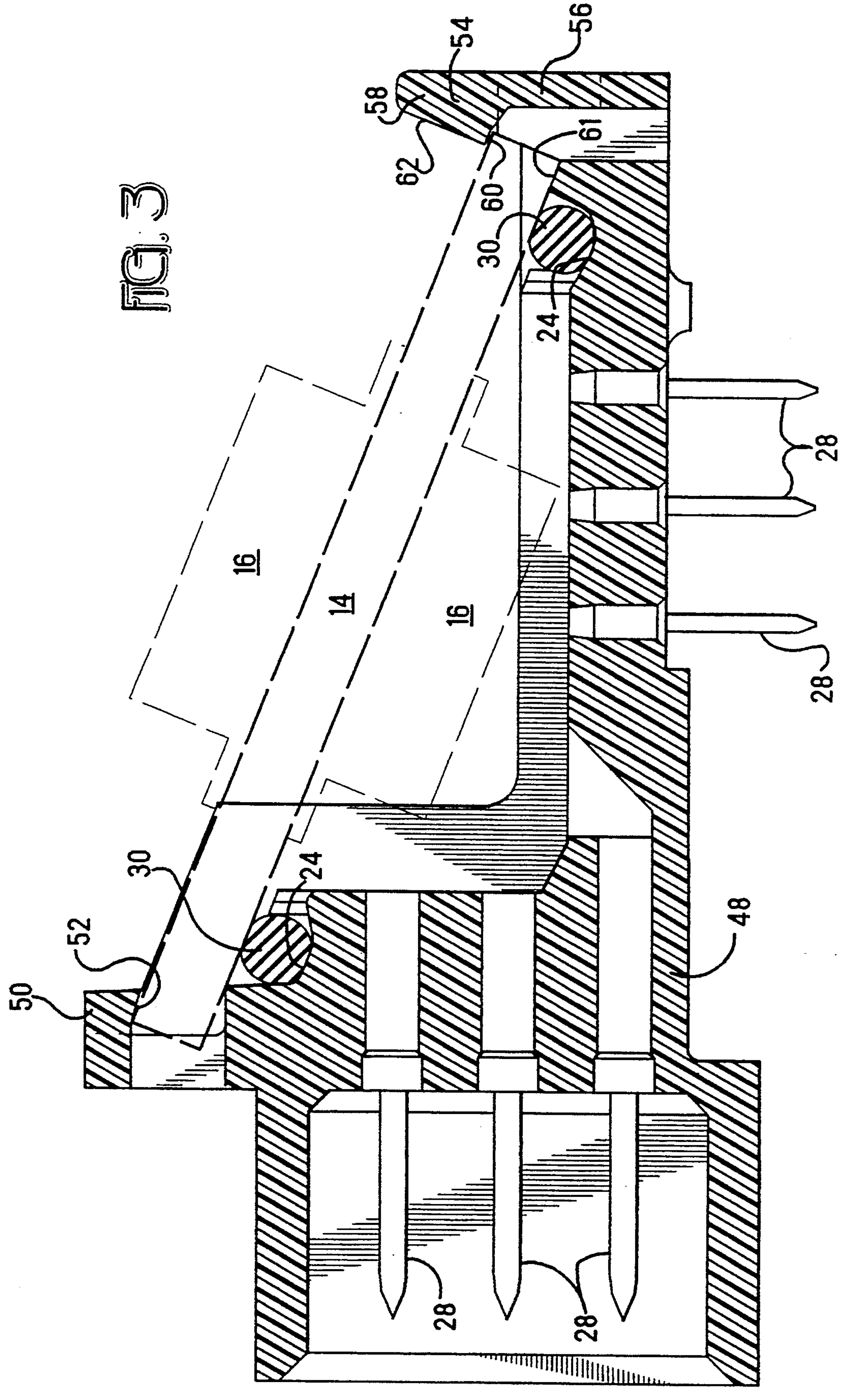
FIG. 3 is a simplified cross sectional view similar to FIG. 1 showing a first embodiment of a board retainer system according to this invention.

FIG. 3 illustrates a first embodiment of an improved retainer system for replacing the spring clip 46 shown in FIG. 1. As shown in FIG. 3, the housing 48 is modified from the housing 10 shown in FIG. 1 in two respects. First, the housing 48 includes means for receiving one end of the substrate 14 in overlying relation to the surface of the housing 48, preferably a pair of bosses 50 secured to the housing 48, one near each housing end. Each boss 50 has an elongated slot 52 which is open toward the channels 24. The size of the slot 52 is such that an end of the substrate 14 is receivable therein with sufficient clearance so that the substrate 14 can be pivoted about that end within the slot 52. Although a boss 50 and a slot 52 have been shown, it is contemplated that other structure may be utilized for receiving an end of the substrate 14, which structure allows pivoting movement of the substrate 14 about an axis substantially parallel to the direction of elongation of the channels 24. For example, retaining clips secured within cavities in the housing 48 can be utilized.

According to this invention, the second modification is that, at the other end of the housing 48, there is preferably a pair of retainers 54, one near each housing end. For the embodiment shown in FIG. 3, the retainer 54 is formed integrally with the housing 48. In any event, the retainer 54 is resilient and movable away from the boss 50 to allow the substrate 14 to be inserted into the slot 52 and pivoted past the retainer 54, with the retainer 54 thereafter overlying the end of the substrate 14. Accordingly, the retainer 54 includes a base 56 which is sufficiently thin to be resilient toward and away from the boss 50 and a latch head 58 secured to the base 56. The latch head 58 includes a lip 60 which is adjacent the base 54 and overlies the substrate 14. The substrate 14 is then held between the lip 60 and the surface 61 on the housing 48. Thus, the combination of the slot 52 and the retainer 54 holds the substrate 14 with the contact elements 30 being deformably compressed to insure good electrical connections. This compression of the contact elements 30 also aids in maintaining the position of the substrate 14 relative to the housing 48. As shown, the latch head 58 includes a ramped surface 62 which extends from the lip 60 away from the housing 48 and away from the boss 50. The ramped surface 62 cooperates with the end of the substrate 14 so that, as the substrate 14 is pivoted past the retainer 54, the end of the substrate 14 engages the ramped surface 62 to cause the retainer base 56 to flex away from the boss 50. This allows the end of the substrate 14 to pass the lip 60 and engage the surface 61. Once the end of the substrate 14 passes the lip 60, the retainer base 56 snaps back to cause the lip 60 to overly the end of the substrate 14.

Figure 4:
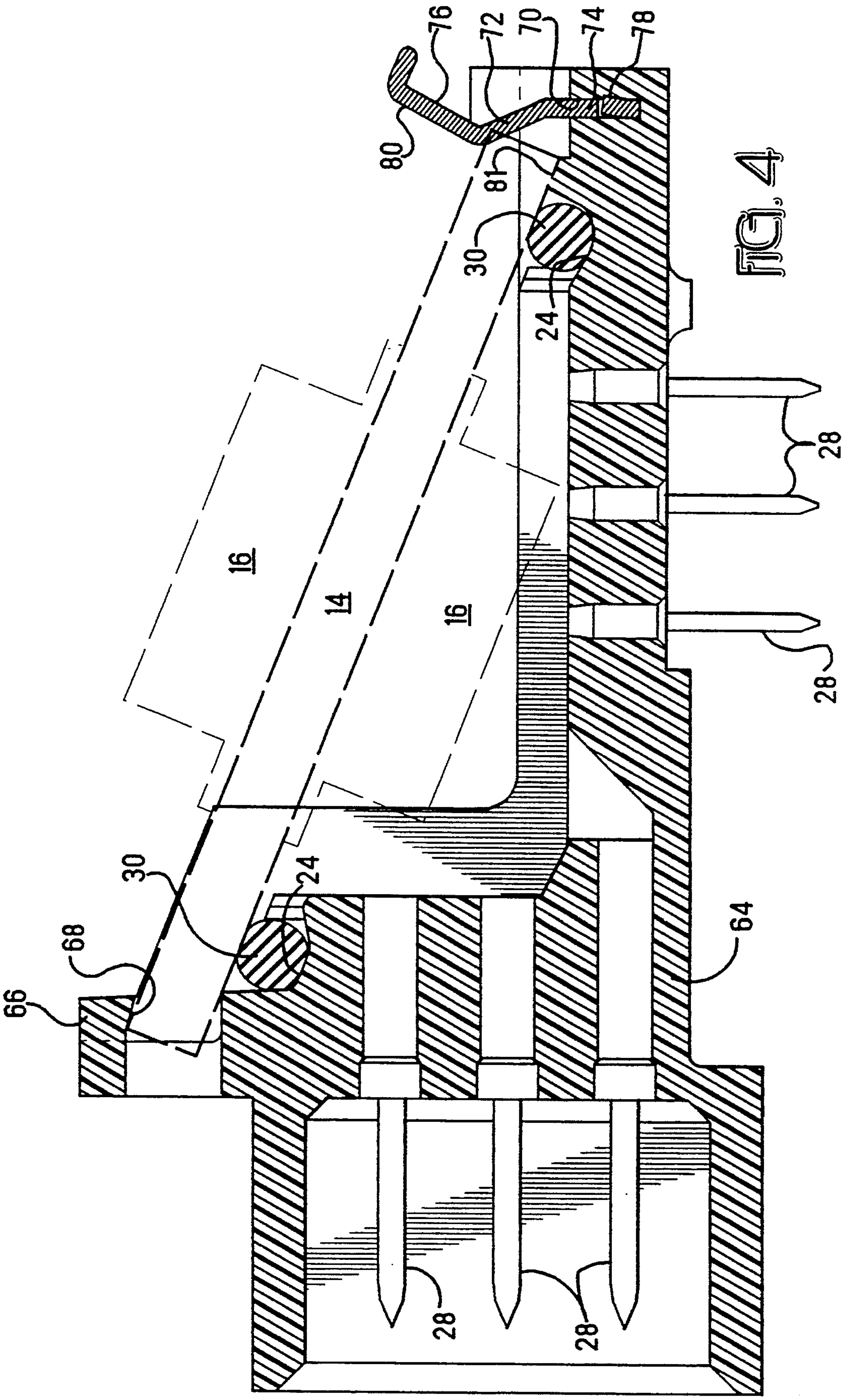
FIG. 4 is a simplified cross sectional view similar to FIG. 1 showing a second embodiment of a board retainer system according to this invention.

FIG. 4 illustrates a second embodiment of the present invention. As shown therein, the housing 64, like the housing 48, is formed with preferably a pair of spaced bosses 66, each having a slot 68. The housing 64 is identical to the housing 48 with the exception of its opposite end, to the right as viewed in FIG. 4. Thus, the housing 64 is formed with preferably a pair of cavities 70 at its far end away from the bosses 66. A retainer 72 is installed within each cavity 70. Preferably, the retainer 72 is formed from sheet stock metal and includes a base 74 and a latch head 76. The base 74 is generally planar, as is the cavity 70, and includes a unitary bent barb 78 which prevents removal of the base 74 from the cavity 70. The latch head 76 extends out of the plane of the base 74 toward the boss 66 and, like the latch head 58 of FIG. 3, includes a ramped surface 80 which extends away from the housing 64 and away from the boss 66. Accordingly, when an end of the substrate 14 is inserted in the slot 68 and the substrate 14 is pivoted downwardly toward the housing 64, its opposed end engages the ramped surface 80 to cause each retainer 72 to resiliently flex away from the bosses 66 and allow the opposed end of the substrate 14 to pass the latch head 76 and engage the surface 81, after which the latch head 76 snaps back and overlies the opposed end of the substrate 14, with the contact elements 30 being deformably compressed.

Figure 5:
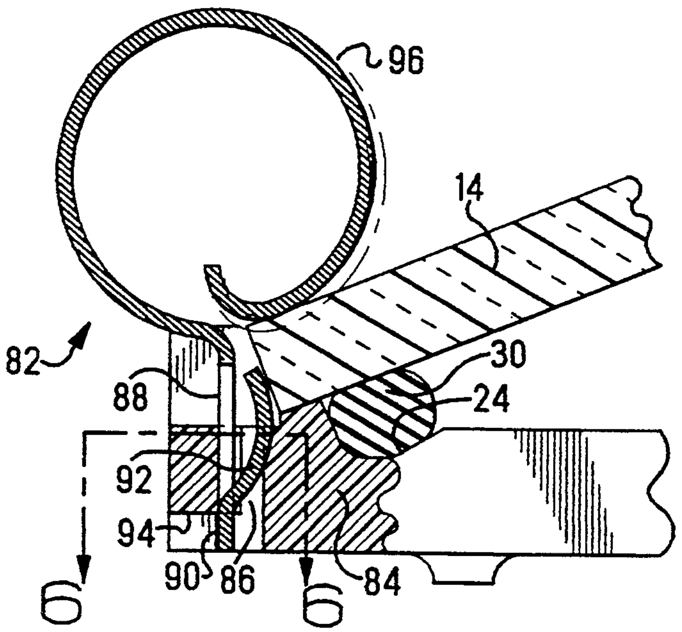
FIG. 5 is a simplified cross sectional view similar to FIG. 1 showing a third embodiment of a board retainer system according to this invention.
Figure 6:
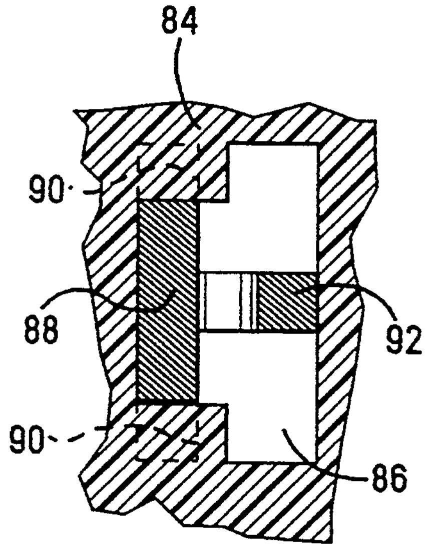
FIG. 6 is a view taken along the line 6—6 in FIG. 5.

FIG. 5 illustrates a retainer 82 which is a third embodiment of the present invention. Each retainer 82 is preferably formed of sheet stock metal and is installed in a housing 84 which is a modified version of the housing 64 of FIG. 4. Referring to FIGS. 5 and 6, the difference between housings 84 and 64 is in the configuration of the cavity 86. The retainer 82 includes a planar base 88 which, at its bottom end, includes a pair of opposed tabs 90 extending within the plane of the base 88 toward and away from the viewer of FIG. 5. When the base 88 is inserted in the cavity 86, the offset curved portion 92 of the base 88 deflects until the tabs 90 pass beyond the wall 94. The tabs 90 then enter the portion of the cavity 86 beneath the wall 94 under the influence of the curved portion 92 to prevent inadvertent removal of the retainer 82. (Alternatively, a barb like that shown in FIG. 4 may be utilized to retain the base 88 in the cavity 86.) The latch head 96 of the retainer 82 is generally cylindrical with a major axis parallel to the direction of elongation of the slot 68 in the boss 66 (FIG. 4). When undeformed, the latch head 96 is as shown in solid lines in FIG. 5. In this embodiment, the end of the substrate 14 is inserted in the slot 68 (FIG. 4) and pivoted toward the housing 84. The base 88 of each retainer 82 is then inserted in the cavity 86, with the latch head 96 overlying the end of the substrate 14 and being deformed, as shown by the broken lines in FIG. 5. If it is desired to thereafter remove the substrate 14, the base 88 is moved toward the right, as viewed in FIGS. 5 and 6, to deflect the curved portion 92 and move the tabs 90 out of interfering engagement with the wall 94. The retainers 82 may then be removed from the cavities 86.

Figure 7:
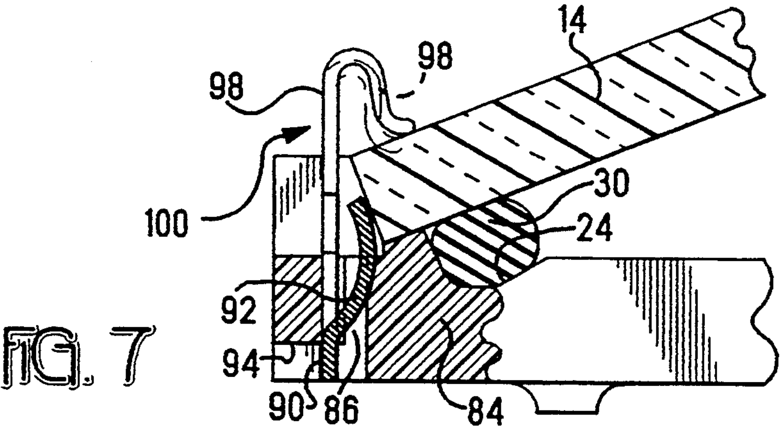
FIG. 7 is a simplified cross sectional view similar to FIG. 1 showing a fourth embodiment of a board retainer system according to this invention.

The difference between the fourth embodiment shown in FIG. 7 and the third embodiment shown in FIG. 5 is that in FIG. 7, the latch head 98 of each retainer 100 is different from the latch head 96 of the retainer 82 while the base and the retainer-receiving cavity of the housing remain the same. As shown in FIG. 7, the latch head 98 extends away from the housing 84, then toward the boss 66 (FIG. 4), and then back toward the housing 84 to form an inverted "J" relative to the housing 84. The undeflected latch head 98 is shown in broken lines. Installation and removal of the substrate 14 are effected in the same manner as described above for the embodiment of FIGS. 5 and 6.

Accordingly, there has been disclosed an improved resilient retainer system for a connector assembly utilizing an intermediate board with active electrical components. While several illustrative embodiments of the present invention have been disclosed, it is understood that various modifications and adaptations to the disclosed embodiments will be apparent to those of ordinary skill in the art and it is intended that this invention only be limited by the scope of the appended claims.

We claim:

1. In a connector assembly which electrically interconnects a first plurality of conductors on the surface of a dielectric substrate (14) with respective ones of a second plurality of conductors on the surface of a dielectric housing (48, 64, 84) and which includes a resilient contact element (30) including an elongated cylindrical elastomeric body member and a flexible film wrapped around said body member, said film having a third plurality of parallel straight line conductors on the surface of said film facing away from said body member so that said third plurality of conductors extends around said body member, there being at least as many of said third plurality of conductors as there are of each of said first and second pluralities of conductors, and said dielectric housing having an elongated open channel (24) on its surface and supporting said contact element therein, said second plurality of conductors on said housing surface being within said channel;

an arrangement for securing said substrate to said housing, comprising:

at least one substrate receiving means (50, 66) secured to said housing for receiving one end of said substrate in overlying relation to the surface of the housing, said receiving means being arranged to allow pivoting movement of said substrate toward and away from said housing surface about an axis substantially parallel to the direction of elongation of said open channel; and at least one retaining means (54, 72, 82, 100) secured to said housing on the side of said channel away from said receiving means for holding the opposed end of said substrate after said substrate one end is received by said receiving means and said substrate is pivoted toward said housing surface, with each of said retaining means thereafter overlying the opposed end of said substrate;

said receiving means and said retaining means being so configured that when said substrate is received by said receiving means and thereafter held by said retaining means, said contact element is deformably compressed by said substrate within said channel.

2. The arrangement according to claim 1 wherein said substrate receiving means includes a boss (50, 66) having an elongated slot (52, 68) open toward said channel, said slot being sized so that said one end of said substrate is receivable therein with sufficient clearance to allow pivoting movement of said substrate toward and away from said housing surface.

3. The arrangement according to claim 1 wherein said retaining means (54, 72) is resilient and movable away from said receiving means to allow said substrate one end to be received by said receiving means and said substrate to be pivoted past said retaining means.

4. The arrangement according to claim 3 wherein said retaining means (54) is integrally molded as part of said housing.

5. The arrangement according to claim 4 wherein said retaining means includes:

a base (56) secured to said housing, said base being resilient and movable toward and away from said receiving means; and a latch head (58) secured to said base, said latch head having a lip (60) adjacent said base and adapted to overlie said opposed end of said substrate.

6. The arrangement according to claim 5 wherein said latch head further includes a ramped surface (62) extending from said lip away from said housing and away from said receiving means, said ramped surface cooperating with said opposed end of said substrate so that said opposed end of said substrate engages said ramped surface as said substrate is pivoted past said retaining means to cause said base to move away from said receiving means and allow said opposed end of said substrate to pass said lip, with said base snapping back once said opposed end of said substrate passes said lip to cause said lip to overlie said opposed end of said substrate.

7. The arrangement according to claim 3 wherein said housing is formed with a cavity (70) on the side of said channel away from said receiving means, and said retaining means (72) includes:

a generally planar base (74) adapted to be inserted in said cavity, said base including means (78) for preventing removal of said base from said cavity; and a latch head (76) secured to said base and extending out of the plane of said base toward said receiving means, said latch head adapted to overlie said opposed end of said substrate.

8. The arrangement according to claim 7 wherein said latch head includes a ramped surface (80) extending away from said housing and toward the plane of said base, said ramped surface cooperating with said opposed end of said substrate so that said opposed end of said substrate engages said ramped surface as said substrate is pivoted past said retaining means to cause said retaining means to resiliently flex away from said receiving means and allow said opposed end of said substrate to pass said latch head, with said retaining means snapping back toward said receiving means once said opposed end of said substrate passes said latch head to cause said latch head to overlie said opposed end of said substrate.

9. The arrangement according to claim 7 wherein said latch head is integral with said base.

10. The arrangement according to claim 9 wherein said retaining means is formed from sheet stock metal.

11. The arrangement according to claim 1 wherein said housing is formed with a cavity (86) on the side of said channel away from said receiving means, and said retaining means (82, 100) includes:

a generally planar base (88) adapted to be inserted in said cavity, said base including means (90, 929) for preventing removal of said base from said cavity; and a latch head (96, 98) secured to said base and extending out of the plane of said base toward said receiving means, said latch head adapted to overlie said opposed end of said substrate.

12. The arrangement according to claim 11 wherein said latch head (96) is generally cylindrical with a major axis parallel to the direction of elongation of said open channel.

13. The arrangement according to claim 12 wherein said latch head is integral with said base, and said retaining means is formed from sheet stock metal.

14. The arrangement according to claim 11 wherein said latch head (98) extends away from said housing then toward said receiving means and then back toward said housing to form an inverted "J" relative to said housing.

15. The arrangement according to claim 14 wherein said latch head is integral with said base, and said retaining means is formed from sheet stock metal.

* * * * *